United States Patent [19]

Matsumura et al.

[11] 4,349,664
[45] Sep. 14, 1982

[54] DOPED ACETYLENE POLYMER AND PROCESS FOR PRODUCTION THEREOF

[75] Inventors: Yoshio Matsumura, Yamato; Ikuo Nozue; Takashi Ukachi, both of Yokohama, all of Japan

[73] Assignee: Japan Synthetic Rubber Co., Ltd., Tokyo, Japan

[21] Appl. No.: 166,995

[22] Filed: Jul. 9, 1980

[51] Int. Cl.³ .............................................. C08F 6/00
[52] U.S. Cl. ................................... 528/491; 528/492; 526/285
[58] Field of Search ............... 528/485, 491, 492, 493; 526/285

[56] References Cited

U.S. PATENT DOCUMENTS 3,622,367 11/1971 Haag et al. ......................... 106/1.05
3,684,534 8/1972 Emerson ........................... 106/1.11

Primary Examiner—John Kight, III
Assistant Examiner—Amelia B. Yarbrough
Attorney, Agent, or Firm—Oblon, Fisher, Spivak, McClelland & Maier

[57] ABSTRACT

Doped acetylene polymers are produced by immersing an acetylene polymer under an inert gas atmosphere in an organic solvent solution of a dopant selected from the group consisting of a platinum group metal complex, a carbonium salt, an oxonium salt and a parabenzoquinone derivative. According to this process, a doped acetylene polymer having any desired electrical conductivity can be produced and the doped acetylene polymer thus obtained has excellent properties as an organic semiconductor material for solar batteries, various sensors, etc.

21 Claims, No Drawings

DOPED ACETYLENE POLYMER AND PROCESS FOR PRODUCTION THEREOF

This invention relates to a process for producing a doped acetylene polymer. More particularly, this invention relates to a process for the production of an acetylene polymer doped with a specific dopant selected from the group consisting of a platinum group metal complex, a carbonium salt, an oxionium salt and a parabenzoquinone derivative.

Acetylene polymers are an insulator or semiconductor having an electrical conductivity in the order of $10^{-5}\ \Omega^{-1}\cdot cm^{-1}$ to $10^{-9}\ \Omega^{-1}\cdot cm^{-1}$ [See Macromol. Chem. Vol. 175, p. 1565 (1978)]. Heretofore, several methods have been proposed to improve the electrical conductivity of this polymer. For instance, J. Amer. Chem. Soc. Vol. 100, p. 1013 (1978) discloses a process for increasing the electrical conductivity of an acetylene polymer by doping the acetylene polymer in the form of a film with HBr, $Cl_2$, $Br_2$, $I_2$, ICl, IBr, $AsF_5$, Na or the like as a dopant. The most effective dopants among them are $I_2$, $AsF_5$, etc., and the highest electrical conductivity obtained by this method is in the order of $10'\Omega^{-1}\cdot cm^{-1}$. A process for doping with a silver salt such as $AgBF_4$ or $AgClO_4$, or $FSO_2OOSO_2F$ has been proposed, respectively, on page 489 or 1066 of J. Chem. Soc. Chem. Comm. (1978). In the former case an electrical conductivity in the order of $10^0\ \Omega^{-1}\cdot cm^{-1}$ can be attained, and in the latter case, an electrical conductivity in the order of $10^2\ \Omega^{-1}\cdot cm^{-1}$ can be obtained. The doping with these chemicals is carried out by allowing the chemicals in the gaseous state or in the form of a solution in a solvent to permeate the acetylene polymer, because the acetylene polymer is insoluble in the chemicals.

The present inventors have made an intensive survey of a process for doping an acetylene polymer and have consequently found that the acetylene copolymer can be doped with a platinum group metal complex, a carbonium salt, an oxonium salt or a parabenzoquinone derivative.

An object of this invention is to provide a novel doped acetylene polymer.

Another object of this invention is to provide a novel process for producing the novel doped acetylene polymer.

Other objects and advantages of this invention will become apparent from the following description.

According to this invention, there is provided an acetylene polymer doped with a platinum group metal complex, a carbonium salt, an oxonium salt, or a parabenzoquinone derivative.

The doped acetylene polymer of this invention can be prepared by immersing an acetylene polymer under an inert gas atmosphere in an organic solvent solution of the platinum group metal complex, carbonium salt, oxonium salt or parabenzoquinone derivative.

The process of this invention has the following characteristic advantages, and in view of these advantages, this invention is wide in application field and very valuable from the commercial point of view:

1. The dopant used in this invention is free from corrosiveness and volatility. This is very advantageous of the doping operation, and in addition, the doped acetylene polymer obtained is stable in performance.

2. According to the process of this invention, the electrical conductivity of the objective doped acetylene polymer can be regulated to any desired order of value.

3. The doped acetylene compound obtained by the process of this invention has excellent performance as an organic semiconductor for solar batteries and various sensors.

4. In particular, the acetylene polymer doped with the platinum group metal complex, the carbonium salt or the oxonium salt is excellent in heat-resistance and light-stability under an inert atmosphere or under vacuum.

The platinum group metal complex used in this invention is a platinum group metal complex active for substitution reaction with olefines, and includes, for example, $(PhCN)_2PdCl_2$, $(COD)PdCl_2$, $[(C_2H_4)PdCl_2]_2$, $(Ph_4C_4)PdCl_2$, $(COD)PtCl_2$, $K[PtCl_3(C_2H_4)]H_2O$, $[Pt(C_2H_4)Cl_2]_2$, $(PhCN)_2PtCl_2$, $[(C_2H_4)_2RhCl]_2$, and $Ru(COD)Cl_2$ wherein COD stands for 1,5-cyclooctadiene and $Ph_4C_4$ for tetraphenylcyclobutadiene. Palladium complexes such as $(PhCN)_2PdCl_2$ and $[(C_2H_4)PdCl_2]_2$ are preferred as the platinum group metal complex used in this invention.

Examples of the carbonium salt and oxonium salt used in this invention include onium salts consisting of combinations of the following cations and anions:

Cations:
triphenylmethyl ion $[(C_6H_5)_3C^+]$,
tropylium ion $(C_7H_7^+)$,
acyl ion $(RCO^+)$,
dialkoxycarbonium ion $[RC(OR')(OR'')^+]$,
triethyloxonium ion $[(C_2H_5)_3O^+]$, In the above formulas, R, R' and R'' represent independentenly an organic group, and usually alkyls, aryls or aralkyls, and R, R' and R'' may be the same or different.

Anions:
$BF_4^-$, $AlCl_4^-$, $FeCl_4^-$, $SnCl_5^-$, $PF_6^-$, $PCl_6^-$, $SbCl_6^-$, $SbF_6^-$, $ClO_4^-$, $CF_3SO_3^-$, $CF_3CO_2^-$.

Preferable cations are triphenylmethyl ion and triethyloxonium ion, and preferable anions are $BF_4^-$ and $ClO_4^-$.

Parabenzoquinone derivatives used in this invention include, for example, 2,3-dicyano-5-chloroparabenzoquinone, 2,3-dichloro-5,6-dicyanoparabenzoquinone, 2,3-dicyano-5-phenylsulphonylparabenzoquinone, 2,3-dicyano-5-chloro-6-phenylsulfonylprabenzoquinone, and 2,3,5,6-tetracyanoparabenzoquinone. Preferable parabenzoquinone derivatives are those having the first half wave reduction potential $(-E\frac{1}{2})$ of less than $-0.2$ V at 25° C. as measured by saturated calomel electrode using $LiClO_4$ as a supporting electrolyte in acetonitrile. The most preferred parabenzoquinone derivative is 2,3-dichloro-5,6-dicyanoparabenzoquinone.

Note: The first half wave reduction potential of parabenzoquinone derivatives is described in, for example, The Chemistry of the Quinoid Componds, Part 2, John Wiley and Sons (1974), p. 770.

As the organic solvents used in this invention, any kind of organic solvent may be used, as far as the solvent can dissolve the above-mentioned platinum group metal complex, carbonium salt, oxonium salt or parabenzoquinone derivative.

As the solvent, there may be mentioned, for example, aromatic hydrocarbons such as benzene, toluene, xylene and the like; nitro compounds such as nitromethane, nitroethane, nitrobenzene and the like; nitrile compounds such as acetonitrile, benzonitrile, and the like;

ether compounds such as diethyl ether, tetrahydrofuran, dioxane, anisole, and the like; lower alcohols such as methanol, ethanol, propanol and the like; halogeno compounds such as dichloromethane, chloroform, chlorobenzene, methylene chloride, trifluoroacetic acid, and the like; ester compounds such as methyl acetate, ethyl acetate and the like; ketone compounds such as acetophenone, acetone and the like; sulfoxide compounds such as dimethylsulfoxide and the like; amide compounds such as N,N-dimethylformamide and the like; and lower organic acids such as acetic acid and the like; and anhydrides of lower organic acids.

The form of the starting acetylene polymer used is not critical, though it may be any of the powder, film and fiber. The doping treatment is preferably conducted under an inert gas atmosphere, since the acetylene polymer is unstable against oxygen. For instance, the doping is carried out by immersing the acetylene polymer in an organic solvent solution of a platinum group metal complex, a carbonium salt, an oxonium salt or a parabenzoquinone derivative. The concentration of the solution used for doping is decided depending upon the solubility of the dopant used because the solubility of the dopant is varied depending on the kind of the dopant used. However, there is seen the tendency that the higher the concentration used, the larger the weight increase of the polymer doped in a short period of time becomes. The period of immersing acetylene polymer may be varied depending upon the concentration of the solution used and the temperature for the doping treatent. The immersion temperature is not critical and the immersion treatment may be effected at any temperature at which the dopant does not decompose and the solvent does not solidify. Generally, the immersion is effected at 10° to 70° C.

The doped acetylene polymer thus prepared is subjected to measurement of electrical conductivity by a 4-probe method. The electrical conductivity of the doped polymer varies depending on the kind of dopant and the weight increase of the doped acetylene polymer. The larger the weight increase of the doped acetylene polymer, the greater the electrical conductivity of the doped acetylene polymer becomes. Therefore, the electrical conductivity of the doped acetylene polymer can be adjusted by controlling the weight increase of the doped acetylene polymer.

Furthermore, the doped acetylene polymer is also handled preferably under an inert gas atmosphere, since the obtained polymer is also unstable against oxygen.

This invention is illustrated below referring to Examples, which are not by way of limitation but by way of illustration. The acetylene polymer used in the Examples was prepared by the following method.

PREPARATION OF ACETYLENE POLYMER

In a 500-ml glass vessel was placed 1.7 ml of titanium tetrabutoxide under a nitrogen atmosphere and was dissolved in 30 ml of toluene in the vessel. Thereto was added 2.7 ml of triethylaluminum with stirring to effect reaction. The vessel containing the reaction product was mounted on a polymerization apparatus, and the catalyst solution contained in the vessel was solidified by liquid nitrogen in the vessel, after which the nitrogen in the vessel was removed by a vacuum pump. The temperature of the vessel was returned to room temperature to vaporize the nitrogen dissolved in the solution and then the solution was again solidified by liquid nitrogen and evacuated. Thereafter, the vessel was kept at a temperature of a dry ice-methanol mixture and purified acetylene was introduced into the vessel under reduced pressure from a gas holder in which the acetylene was stored in the static state.

Polymerization occurred at once on the surface of the soluton and an acetylene polymer in the form of a film was formed. Thirty minutes after the introduction of acetylene, the vessel was taken out of the polymerization apparatus and nitrogen gas was introduced into the vessel. The catalyst solution was removed from the vessel by means of a syringe, and thereafter the polymer obtained was dried and washed thoroughly with deoxygenated toluene. The toluene was thereafter removed by means of a syringe, and the contents of the vessel were dried under vacuum to obtain an acetylene polymer film.

The electrical conductivity of this acetylene polymer film as measured by a 4-probe method was $10^{-8}$ $\Omega^{-1} \cdot cm^{-1}$.

EXAMPLE 1

An acetylene polymer film was immersed in a solution of 0.2 g of $[(C_2H_4)PdCl_2]_2$ in 20 ml of dried deoxygenated chloroform, and allowed to stand at room temperature for 24 hrs. This acetylene polymer film was thereafter transferred to another vessel, washed with chloroform and vacuum-dried. The electrical conductivity of the doped acetylene film thus obtained was $3 \times 10^{-2} \Omega^{-1} \cdot cm^{-1}$ as measured by a 4-probe method. The doped acetylene polymer in the form of a film was subjected to the ESCA (electron spectroscopy for chemical analysis) measurement to detect only divalent Pd. From this fact, it was understood that the electrical conductivity of the doped acetylene polymer was increased as a result of the acetylene polymer having been doped with the Pd compound and the Pd metal deposited upon decomposition of the complex did not participate in the increase in electrical conductivity.

When the doped acetylene polymer was allowed to stand for 6 months at 100° C. at a reduced pressure of $10^{-1}$ Torr or under natural weather conditions in a glass container at a reduced pressure of $10^{-1}$ Torr, substantially no change in electrical conductivity was observed.

It is to be noted that, in this Example, all the procedures were carried out under a nitrogen atmosphere so as not to expose the acetylene polymer to air, and the same applies to the subsequent Examples unless otherwise specified.

EXAMPLE 2

An acetylene polymer film was immersed in a solution of 0.1 g of $(PhCN)_2PdCl_2$ in 20 ml of dried deoxygenated methylene chloride and allowed to stand at room temperature for 24 hrs. This acetylene polymer film was then transferred to anothe vessel, washed with fresh methylene chloride and vacuum-dried. The doped acetylene polymer film thus obtained had an electrical conductivity of $3 \times 10^{-3} \Omega^{-1} \cdot cm^{-1}$.

EXAMPLE 3

An acetylene polymer film was immersed in a solution of 0.1 g of $(PhCN)_2PtCl_2$ in 20 ml of dried deoxygenated methylene chloride and allowed to stand at room temperature for 24 hrs. This acetylene polymer film was then transferred to another vessel and washed with fresh methylene chloride and vacuum-dried. The electrical conductivity of the doped acetylene polymer film thus obtained was $7 \times 10^{-5} \, \Omega^{-1} \cdot cm^{-1}$.

EXAMPLE 4

An acetylene polymer film was immersed in a solution of 0.1 g of $[(C_2H_4)_2RhCl]_2$ in dried deoxygenated methylene chloride and allowed to stand at room temperature for 24 hours. This acetylene polymer film was thereafter transferred to another vessel, washed with fresh methylene chloride and vacuum-dried.

The electrical conductivity of the doped acetylene polymer film thus obtained was $5 \times 10^{-5} \, \Omega^{-1} \cdot cm^{-1}$.

EXAMPLE 5

An acetylene polymer film was immersed in a solution of 0.1 g of $Ru(COD)Cl_2$ in 20 ml of dried deoxygenated chloroform and allowed to stand at room temperature for 24 hrs. This acetylene polymer film was thereafter transferred to another vessel, washed with fresh chloroform and vacuum-dried.

The doped acetylene polymer film thus obtained had an electrical conductivity of $6 \times 10^{-5} \, \Omega^{-1} \cdot cm^{-1}$.

EXAMPLE 6

An acetylene polymer film was immersed in a dried methylene chloride solution of $(C_2H_5)_3O^+BF_4^-$ (0.3 g/10 ml), subjected to deaeration, and then allowed to stand at room temperature for 24 hrs. This acetylene polymer film was thereafter transferred to another vessel, washed with fresh methylene chloride, and vacuum-dried. All the procedures were carried out under an argon atmosphere.

The doped acetylene polymer film thus obtained had an electrical conductivity of $5 \times 10^{-2} \, \Omega^{-1} \cdot cm^{-1}$. When the doped acetylene polymer was allowed to stand for 6 months at 100° C. at a reduced pressure of $10^{-1}$ Torr or under natural weather conditions in a glass container at a reduced pressure of $10^{-1}$ Torr, substantially no change in electrical conductivity was observed.

EXAMPLE 7

An acetylene polymer film was immersed in a dried methylene chloride solution of $(C_6H_5)_3C^+BF_4^-$ (0.3 g/10 ml), subjected to deaeration, and allowed to stand at room temperature for 24 hrs. This acetylene polymer film was thereafter transferred to another vessel, washed with fresh methylene chloride and dried under vacuum. The doped acetylene polymer film thus obtained had an electrical conductivity of $3 \times 10^{-1} \, \Omega^{-1} \cdot cm^{-1}$. All the procedures were carried out under an argon atmosphere.

EXAMPLE 8

In 20 ml of dried deoxygenated benzene was dissolved 0.1 g of 2,3-dichloro-5,6-dicyanoparabenzoquinone ($-E_{\frac{1}{2}} = -0.5$ V). An acetylene polymer film was immersed in the solution, and allowed to stand at room temperature for 24 hrs. This acetylene polymer film was thereafter transferred to another vessel and vacuum-dried. The doped acetylene polymer film thus obtained had an electrical conductivity of $2 \times 10^{-1} \, \Omega^{-1} \cdot cm^{-1}$.

EXAMPLE 9

In 20 ml of dried deoxygenated benzene was dissolved 0.1 g of 2,3-dicyano-5-chloroparabenzoquinone ($-E_{\frac{1}{2}} = -0.41$ V). An acetylene polymer film was immersed in the solution and allowed to stand at room temperature for 24 hrs. This acetylene polymer film was transferred to another vessel and vacuum-dried. The doped acetylene polymer film thus obtained had an electrical conductivity of $5 \times 10^{-3} \, \Omega^{-1} \cdot cm^{-1}$.

EXAMPLE 10

An acetylene polymer film was immersed in a solution of 0.1 g of $K[PtCl_3(C_2H_4)] \cdot H_2O$ in 20 ml of dried deoxygenated acetone and allowed to stand at room temperature for 24 hrs. This acetylene polymer film was thereafter transferred to another vessel, washed with fresh acetone and then dried under vacuum. The doped acetylene polymer film thus obtained had an electrical conductivity of $8 \times 10^{-5} \, \Omega^{-1} \cdot cm^{-1}$.

EXAMPLE 11

An acetylene polymer film was immersed in a solution of 0.1 g of $(COD)PdCl_2$ in 20 ml of dried deoxygenated methylene chloride, and allowed to stand at room temperature for 24 hrs. This acetylene polymer film was thereafter transferred to another vessel, washed with fresh methylene chloride, and then dried under vacuum. The doped acetylene polymer film thus obtained had an electrical conductivity of $7 \times 10^{-6} \, \Omega^{-1} \cdot cm^{-1}$.

EXAMPLE 12

An acetylene polymer film was immersed in a solution of 0.1 g of $(COD)PtCl_2$ in 20 ml of dried deoxygenated fresh methylene chloride, and allowed to stand at room temperature for 24 hrs, after which the acetylene polymer film was taken out of the solution, washed with methylene chloride, and then dried under vacuum. The doped acetylene polymer film thus obtained had an electrical conductivity of $2 \times 10^{-5} \, \Omega^{-1} \cdot cm^{-1}$.

EXAMPLE 13

An acetylene polymer film was immersed in a solution of 0.1 g of $(Ph_4C_4)PdCl_2$ in 20 ml of dried deoxygenated methylene chloride, and allowed to stand at room temperature for 24 hrs. This acetylene polymer film was thereafter transferred to another vessel, washed with fresh methylene chloride, and then dried under vacuum. The doped acetylene polymer film thus obtained had an electrical conductivity of $3 \times 10^{-5} \, \Omega^{-1} \cdot cm^{-1}$.

EXAMPLE 14

An acetylene polymer film was immersed in a solution of 0.2 g of $p\text{-}ClC_6H_4N_2PF_6$ in 20 ml of dried deoxygenated ethanol, and allowed to stand at room temperature for 24 hrs. This acetylene polymer film was thereafter transferred to another vessel, washed with fresh ethanol, and then dried under vacuum. The doped acetylene polymer film was thus obtained had an electrical conductivity of $1 \times 10^{-4} \, \Omega^{-1} \cdot cm^{-1}$.

EXAMPLE 15

An acetylene polymer film was immersed in a solution of 0.1 g of $C_{13}H_9SBr_3$ in 20 ml of dried deoxygenated methanol, and allowed to stand at room temperature for 24 hrs. This acetylene polymer film was thereafter transferred to another vessel, washed with fresh methanol, and then dried under vacuum. The doped acetylene polymer film thus obtained had an electrical conductivity of $7 \times 10^{-5} \, \Omega^{-1} \cdot cm^{-1}$.

Said $C_{13}H_9SBr_3$ means thioxanthylium perbromide having the structural formula,

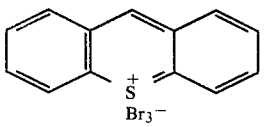

EXAMPLE 16

An acetylene polymer film was immersed in a solution of 0.1 g of $Ph_3C^+ClO_4^-$ in 20 ml of dried deoxygenated methylene chloride, and allowed to stand at room temperature for 24 hrs. This acetylene polymer film was thereafter transferred to another vessel, washed with fresh methylene chloride and then dried under vacuum. The doped acetylene polymer thus obtained had an electrical conductivity of $3 \times 10^1$ $\Omega^{-1} \cdot cm^{-1}$.

EXAMPLE 17

Triphenylmethyl trifluoroacetate was synthesized by adding 0.5 g of $Ph_3COH$ to 3 ml of dried deoxygenated trifluoroacetic acid, and in the resulting reaction mixture was immersed an acetylene polymer film, and allowed to stand at room temperature for 24 hrs. This acetylene polymer film was thereafter transferred to another vessel, washed with fresh trifluoroacetic acid and then dried under vacuum. The doped acetylene polymer film thus obtained had an electrical conductivity of $3 \times 10^{-4}$ $\Omega^{-1} \cdot cm^{-1}$.

For comparison, an acetylene polymer film was immersed in 3 ml of deoxygenated trifluoroacetic acid and allowed to stand at room temperature for 24 hrs. The acetylene polymer film was thereafter taken out of the trifluoroacetic acid, and then dried under vacuum. The acetylene polymer film thus treated had an electrical conductivity of less than $10^{-6}$ $\Omega^{-1} \cdot cm^{-1}$.

EXAMPLE 18

An acetylene polymer film was immersed in a solution of 0.1 g of $C_{13}H_9SI_5$ in 20 ml of dried deoxygenated methanol and allowed to stand at room temperature for 24 hrs. This acetylene polymer film was thereafter transferred to another vessel, washed with fresh methanol and then dried under vacuum. The doped acetylene polymer film had an electrical conductivity of $8 \times 10^{-4}$ $\Omega^{-1} \cdot cm^{-1}$.

Said $C_{13}H_9SI_5$ means thioxanthylium periodide having the structural formula,

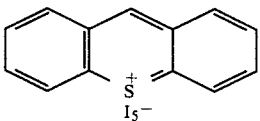

What is claimed is:

1. An acetylene polymer doped with a dopant selected from the group consisting of a platinum group metal complex, a carbonium salt, an oxonium salt and a parabenzoquinone derivative.

2. A doped acetylene polymer according to claim 1, wherein the dopant is a platinum group metal complex selected from the group consisting of $(PhCN)_2PdCl_4$, $(COD)PdCl_2$, $[(C_2H_4)PdCl_2]_2$, $(Ph_4C_4)PdCl_2$, $(COD)PtCl_2$, $K[PtCl_3(C_2H_4)]H_2O$, $[Pt(C_2H_4)Cl_2]_2$, $(PhCN)_2PtCl_2$, $[(C_2H_4)RhCl]_2$ and $Ru(COD)Cl_2$ wherein COD stands for 1,5-cyclooctadiene and $Ph_4C_4$ for tetraphenylcyclobutadiene.

3. A doped acetylene polymer according to claim 1, wherein the dopant is a palladium complex.

4. A doped acetylene polymer according to claim 3, wherein the dopant is $(PhCN)_2PdCl_2$ or $[(C_2H_4)PdCl_2]_2$.

5. A doped acetylene polymer according to claim 1, wherein the dopant is a combination of an anion selected from the group consisting of $BF_4^-$, $AlCl_4^-$, $FeCl_4^-$, $SnCl_5^-$, $PF_6^-$, $PCl_6^-$, $SbCl_6^-$, $SbF_6^-$, $ClO_4^-$, $CF_3SO_3^-$ and $CF_3CO_2^-$ with a cation selected from the group consisting of triphenylmethyl ion $[(C_6H_5)_3C^+]$, tropylium ion $(C_7H_7^+)$, acyl ion $(RCO^+)$, triethyloxonium ion $[(C_2H_5)_3O^+]$, and dialkoxycarbonium ion $[RC(OR')(OR'')^+]$ in which R, R' and R'' stand for organic groups.

6. A doped acetylene polymer according to claim 1, wherein the dopant is a combination of an anion selected from the group consisting of $BF_4^-$ and $ClO_4^-$ with a cation selected from the group consisting of triphehylmethyl ion $[(C_6H_5)_3C^+]$ and triethyloxonium ion $[(C_2H_5)_3O^+]$.

7. A doped acetylene polymer according to claim 1, wherein the dopant is a parabenzoquinone derivative selected from the group consisting of 2,3-dicyano-5-chloroparabenzoquinone, 2,3-dichlorodicyanoparabenzoquinone, 2,3-dicyano-5-phenylsulfonylparabenzoquinone, 2,3-dicyano-5-chloro-6-phenylparabenzoquinone and 2,3,5,6-tetracyanoparabenzoquinone.

8. A doped acetylene polymer according to claim 1, wherein the parabenzoquinone derivative has a first half wave reduction potential $(-E_{\frac{1}{2}})$ of less than $-0.2$ V as measured at 25° C. by means of a saturated calomel electrode using $LiClO_4$ in acetonitrile as the supporting electrolyte.

9. A doped acetylene polymer according to any one of claims 1 or 2, wherein the starting acetylene polymer is in the form of film.

10. A process for producing a doped acetylene polymer which comprises immersing an acetylene polymer under an inert gas atmosphere in an organic solvent solution of a dopant selected from the group consisting of a platinum group metal complex, a carbonium salt, an oxonium salt and a parabenzoquinone derivative.

11. A process according to claim 1, wherein the immersion is carried out at 10° to 70° C.

12. A process according to claim 10, wherein the dopant is a platinum group metal complex selected from the group consisting of $(PhCN)_2PdCl_2$, $(COD)PdCl_2$, $[(C_2H_4)PdCl_2]_2$, $(Ph_4C_4)PdCl_2$, $(COD)PtCl_2$, $K[PtCl_3(C_2H_4)]H_2O$, $[Pt(C_2H_4)Cl_2]_2$, $(PhCN)_2PtCl_2$, $[(C_2H_4)_2RhCl]_2$, and $Ru(COD)Cl_2$, wherein COD stands for 1,5-cyclooctadiene and $Ph_4C_4$ for tetraphenylcyclobutadiene.

13. A process according to claim 10, wherein the dopant is a palladium complex.

14. A process according to claim 13, wherein the palladium complex is $(PhCN)_2PdCl_2$ or $[(C_2H_4)PdCl_2]_2$.

15. A process according to claim 1, wherein the dopant is a combination of a cation selected from the group consisting of triphenylmethyl ion $[(C_6H_5)_3C^+]$, tropylium ion $(C_7H_7^+)$, acyl ion $(RCO^+)$, dialkoxycarbonium ion $[RC(OR')_2^+]$, and triethyloxonium ion $[(C_2H_5)_3O^+]$ with an anion selected from the group consisting of $BF_4^-$, $AlCl_4^-$, $FeCl_4^-$, $SnCl_5^-$, $PF_6^-$, $SbClhd 6^-$, $SbF_6^-$, $ClO_4^-$, $CF_3SO_3^-$ and $CF_3CO_2^-$.

16. A process according to claim 1, wherein the dopant is a parabenzoquinone derivative selected from the group consisting of 2,3-dicyano-5-chloroparabenzoquinone, 2,3-dichloro-5,6-dicyanoparabenzoquinone, 2,3-dicyano-5-phenylsulfonylparabenzoquinone, 2,3-dicyano-5-chloro-6-phenylsulfonylparabenzoquinone and 2,3,5,6-tetracyanoparabenzoquinone.

17. A process according to claim 1, wherein the parabenzoquinone derivative has a first half wave reduction potential ($-E_{\frac{1}{2}}$) of less than $-0.2$ V as measured at 25° C. by means of a saturated calomel electrode using $LiClO_4$ as a supporting electrolyte in acetonitrile.

18. A process according to claim 1, wherein the organic solvent is selected from the group consisting of aromatic hydrocarbons, nitrile compounds, nitro compounds, ether compounds, lower alcohols, halogeno compounds, ester compounds, ketone compounds, sulfoxide compounds and lower organic acids and their anhydrides.

19. A process according to claim 10, wherein the organic solvent is a compound selected from the group consisting of benzene, toluene, xylene, nitromethane, nitroethane, nitrobenzene, acetonitrile, benzonitrile, diethyl ether, tetrahydrofuran, dioxane, anisole, methanol, ethanol, propanol, dichloromethane, chloroform, chlorobenzene, methylene chloride, trifluoroacetic acid, methyl acetate, ethyl acetate, acetone, acetophenone, dimethylsulfoxide, N,N-dimethylformamide, acetic acid and acetic anhydride.

20. A doped acetylene polymer according to claim 1, wherein the dopant is selected from the group consisting of a carbonium salt, an oxonium salt and a parabenzoquinone derivative.

21. A process according to claim 10, wherein the dopant is selected from the group consisting of a carbonium salt, an oxonium salt and a parabenzoquinone derivative.

* * * * *

UNITED STATES PATENT AND TRADEMARK OFFICE
CERTIFICATE OF CORRECTION

PATENT NO. : 4,349,664
DATED : September 14, 1982
INVENTOR(S) : Yoshio Matsunura et al It is certified that error appears in the above-identified patent and that said Letters Patent is hereby corrected as shown below:

Please add the Foreign Application Priority Data as follows:

[30] -- Foreign Application Priority Data

July 10, 1979   [JP] Japan......86402/79

July 10, 1979   [JP] Japan......86403/79

August 28, 1979   [JP] Japan....108641/79 --

Signed and Sealed this

Seventeenth Day of May 1983

[SEAL]

Attest:

DONALD J. QUIGG

Attesting Officer   Acting Commissioner of Patents and Trademarks